United States Patent [19]
Hwang

[11] Patent Number: 5,843,825
[45] Date of Patent: Dec. 1, 1998

[54] FABRICATION METHOD FOR SEMICONDUCTOR DEVICE HAVING NON-UNIFORMLY DOPED CHANNEL (NUDC) CONSTRUCTION

[75] Inventor: Lee-Yeun Hwang, Choongcheongbuk-Do, Rep. of Korea

[73] Assignee: LG Semicon Co., Ltd., Choongcheongbuk-Do, Rep. of Korea

[21] Appl. No.: 757,939

[22] Filed: Nov. 27, 1996

[30] Foreign Application Priority Data

Nov. 30, 1995 [KR] Rep. of Korea ................. 45523/1995

[51] Int. Cl.⁶ ................................................ H01L 21/336
[52] U.S. Cl. ............................ 438/291; 438/563; 438/564
[58] Field of Search ................................. 438/324, 563.4, 438/289, 291

[56] References Cited

U.S. PATENT DOCUMENTS

| | | | |
|---|---|---|---|
| 3,200,019 | 8/1965 | Scott, Jr. et al. ........................ | 438/563 |
| 3,341,381 | 9/1967 | Bergman et al. ........................ | 438/563 |
| 3,975,220 | 8/1976 | Quinn et al. . | |
| 3,980,507 | 9/1976 | Carley . | |
| 3,980,508 | 9/1976 | Takamiya et al. . | |
| 4,175,317 | 11/1979 | Aoki et al. . | |
| 4,830,983 | 5/1989 | Thorton . | |
| 5,552,342 | 9/1996 | Itou et al. . | |
| 5,605,855 | 2/1997 | Chang et al. . | |

FOREIGN PATENT DOCUMENTS 62-216322A 9/1987 Japan ...................................... 438/324

OTHER PUBLICATIONS

"Source-to-Drain Nonuniformly Doped Channel (NUDC) MOSFET Structures for High Current Drivability and Threshold Voltage Controllability", Okumura et al., IEEE Transactions on Electron Devices, vol. 39, No. 11, Nov. 1992, pp. 2541–2552.

*Primary Examiner*—John Niebling
*Assistant Examiner*—Richard A. Booth

[57] ABSTRACT

A fabrication method for a semiconductor memory device with a non-uniformly doped channel(hereinafter, called NUDC) formed in a semiconductor substrate with a thin central portion that becomes gradually thicker toward the edges of the substrate. The method includes forming an impurity-bearing layer on a semiconductor substrate, selectively etching the impurity containing layer in a manner such that the portion of the impurity-bearing layer serving as a gate region is formed to be thin at a central portion thereof and gradually thickens as it nears the edges thereof; forming a first conductive impurity region by driving the impurity from the impurity containing layer into the semiconductor substrate, stripping the impurity containing layer, sequentially forming a gate insulating film and a gate electrode on the semiconductor substrate, and forming a second conductive impurity region in the semiconductor substrate at the sides of the gate electrode.

20 Claims, 5 Drawing Sheets

FABRICATION METHOD FOR SEMICONDUCTOR DEVICE HAVING NON-UNIFORMLY DOPED CHANNEL (NUDC) CONSTRUCTION

BACKGROUND OF THE INVENTION

1. Field of the Invention

The present invention relates to a fabrication method for a semiconductor device, and more particularly, to an improved fabrication method for a semiconductor device which has a non-uniformly doped channel(hereinafter, called NUDC) construction formed in a conductive impurity region that is thinly formed at the central portion of the region and gradually becomes thicker as it approaches the edges of the region.

2. Description of the Conventional Art

These days, a micronization trend exists in manufacturing semiconductor memory devices. As the length of channels becomes shorter, and therefore, to prevent an inevitable characteristic degradation of the device, a dopant is used for the prevention of an inversion and a punch-through, and for controlling a threshold voltage at the channel formation region when a predetermined voltage is applied to a gate. In doping, the concentration of the dopant doped at the channel formation region is uniformly distributed with respect to the direction of the depth and length of the channel.

A conventional semiconductor memory device containing a dopant at a uniform concentration in the channel formation region can avoid a characteristic degradation of the device by controlling an average concentration of the dopant and the doping depth to a predetermined degree during fabrication. But as the semiconductor memory devices trend toward supermicronization, conventional device construction cannot yield the optimum characteristics of the device. For example, when the length of the channel is less than approximately 0.4 $\mu$m, the threshold voltage and the breakdown voltage at the source/drain is sharply reduced, which has been proven through experimentation.

To overcome these problems, a semiconductor memory device having the NUDC construction was suggested. An example of a non-uniformly doped channel used in a semiconductor device is shown in IEEE Electron Devices, vol. 39, pp. 2641–2552 (1992), entitled "Source to Drain Non-Uniformly Doped MOSFET Structure for High Current Drivability & Vth: Channel Edge."

Hereafter, a description will be given of the construction and fabrication of an NUDC semiconductor memory device, with reference to the accompanying drawings.

FIG. 1 is a cross-sectional view showing a conventional NUDC semiconductor memory device. As shown in this drawing, the semiconductor memory device includes a semiconductor substrate 11 in which an active region is defined by a field oxide film 12, a gate oxide film 13 formed on the surface of the active region, a gate electrode 14 formed on the gate oxide film 13, source/drain regions 30,40 having an LDD (Lightly Doped Drain) region 31,41, and an NUDC region 20 in which a dopant is doped nonuniformly.

The NUDC region 20 has the lowest concentration of the dopant implanted therein at its central portion 21, and the dopant concentration becomes higher in proportion to the distance from the central portion(channel edge 22).

The fabrication method of the above-described NUDC semiconductor memory device will be described in detail, referring to FIGS. 2A through 2F.

First, as shown in FIG. 2A, the gate oxide film 13 is formed on the semiconductor substrate 11 in which the active and field regions are defined.

Next, as shown in FIG. 2B, an ion implantation is performed in the surface of the active region through the gate oxide film 13. Here, the distribution of a dopant concentration implanted in the surface is made uniformly along the length of the gate oxide film 13, and the concentration of the dopant is made low correspondingly to that of the central portion 21 of the NUDC region 20 which is last formed.

As shown in FIG. 2C, the gate electrode 14 is formed on the gate oxide film 13, and a tilt & rotation ion implantation is performed wherein the device is tilted by a predetermined tilt angle($\theta$) and then rotated to implant ions. In the tilt & rotation ion implantation, the gate is used as a mask and the tilt angle($\theta$) of the device is controlled to implant ions to the edge 22 of the NUDC region 20. As a result, the NUDC construction is formed such that the channel edge 22 has a relatively higher impurity concentration than the central portion 21 of the NUDC region 20.

FIGS. 2D through 2F show the sequential process for forming the source/drain regions 30,40 including the LDD regions 31,41 after the above NUDC construction is formed.

FIG. 1 shows the fabricated NUDC semiconductor memory device, which has the problem that the threshold voltage and the breakdown voltage become sharply reduced due to the supermicronization of the gate in the conventional NUDC semiconductor memory device.

Moreover, according to the conventional fabrication method of the NUDC semiconductor device, a plurality of ion implantations must be performed as shown in FIGS. 2B and 2C to form the channel formation region so as to have the NUDC construction, and consequently the fabrication process becomes complicated. In particular, an additional tilt and rotation apparatus is required to perform the tilt & rotation ion implantation, as shown in FIG. 2C.

Furthermore, the distribution of the dopant concentration at the NUDC region is not uniformly made but can have a large deviation.

SUMMARY OF THE INVENTION

Accordingly, it is an object of the present invention to provide an improved fabrication method for a semiconductor device having NUDC construction which is capable of making the process simple and minimizing deviations in dopant concentration distributions.

To achieve the above object, there is provided a novel and useful fabrication method for an NUDC semiconductor memory device according to the present invention which includes forming a first conductive bearing layer on a semiconductor substrate, selectively etching the impurity-containing layer such that the impurity-containing layer serving as a gate region is formed to be thin at a central portion and increasing thicker as it nears the edges thereof forming a first conductive impurity region by driving the impurity from the impurity-containing layer into the semiconductor substrate; stripping the impurity-containing layer; sequentially forming a gate insulating film and a gate electrode on the semiconductor substrate, and forming a second conductive impurity region in the semiconductor substrate at the sides of the gate electrode.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become aparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Referring to the accompanying drawings, the fabrication method for a NUDC semiconductor memory device according to the present invention will now be described in detail.

Figure 1:
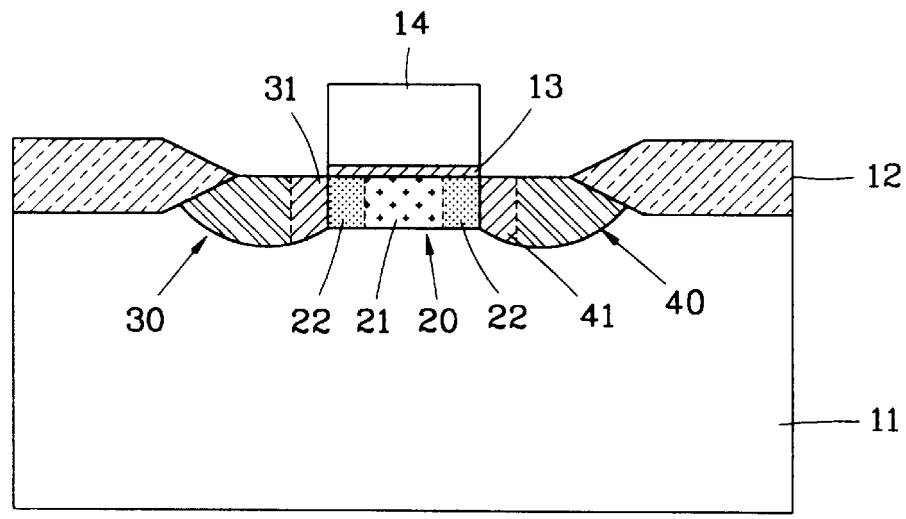
FIG. 1 is a cross-sectional view of an NUDC semiconductor memory device according to the conventional art.
Figure 2A:
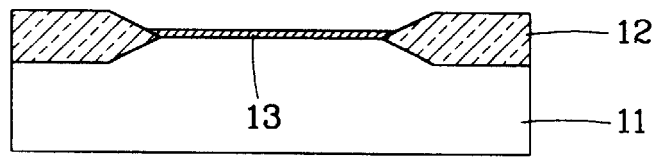
FIGS. 2A through 2F are cross-sectional views showing a fabrication method for the NUDC semiconductor memory device in FIG. 1.
Figure 2B:
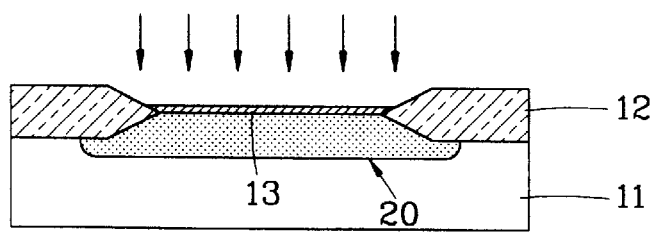
Figure 2C:
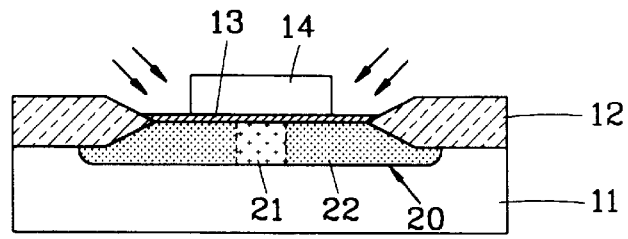
Figure 2D:
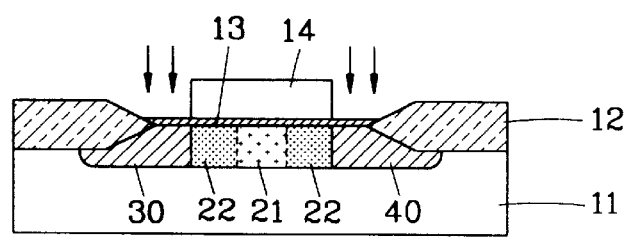
Figure 2E:
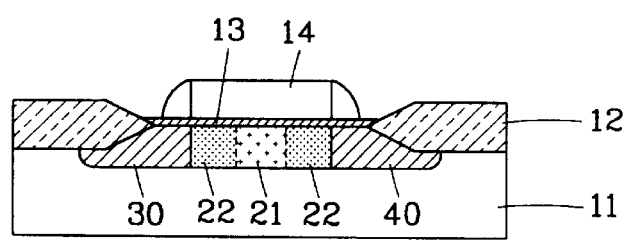
Figure 2F:
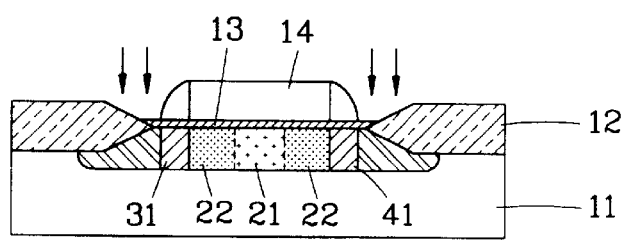
Figure 3:
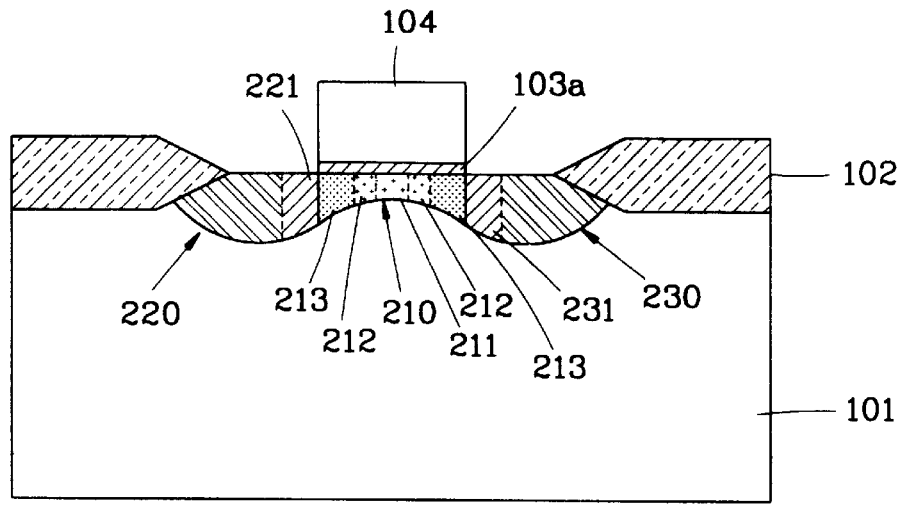
FIG. 3 is a cross-sectional view of an NUDC semiconductor memory device according to the present invention.

FIGS. 4A through 4J are cross-sectional views showing a fabrication method for the NUDC semiconductor memory device in FIG. 3.

Figure 4A:
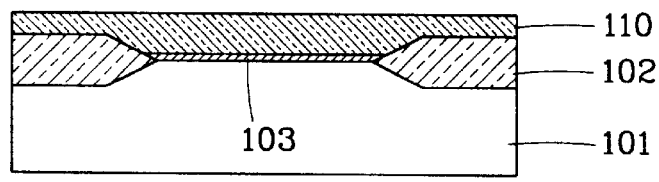
FIGS. 4A through 4J are cross-sectional views showing a fabrication method for the NUDC semiconductor memory device of FIG. 3.

As shown in FIG. 4A, after active field regions are defined by a field oxide film 102, a first conductive impurity-bearing layer 110 is formed on a semiconductor substrate 101 having a first oxide film 103 formed thereon. The impurity-containing layer 110, e.g., is an oxide film having an impurity or a doped polysilicon layer. The oxide film has a BSG (Boron Silicate Glass) and an insitu doping can be adopted to form the doped polysilicon layer by a chemical vapor deposition (CVD). The first conductive impurity of the first conductive layer 11D has boron concentration approximately 1E19~E20atom/cm$^3$. The first oxide film 103 is, e.g., an oxide silicon film formed by an oxidation process for the protection of the semiconductor substrate 101.

Figure 4B:
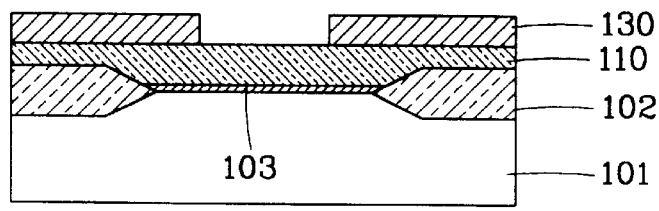

Next, as shown in FIG. 4B, a photoresist layer is formed on the impurity-bearing layer 110 and the photoresist layer formed at the region at which a gate electrode is to be formed is stripped to form a photoresist layer pattern 130, resulting in the formation of an opening at the gate region.

Figure 4C:
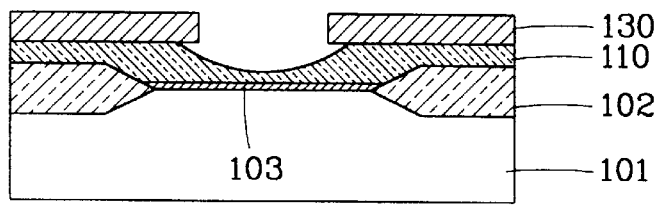
Figure 4D:
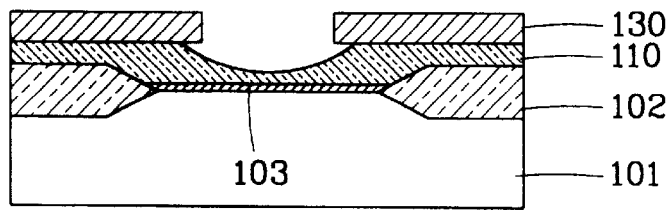

Then, as shown in FIGS. 4C and 4D, using the photoresist pattern 130 as a mask, an anisotropic etching is carried out on the impurity-bearing layer 110. Thus, the impurity-bearing layer 110 is selectively etched in a manner such that it has a thin central portion corresponding to the gate region and thicker edges in proportion to the distance as it thins out to the edges. Therefore, the shape of the impurity-bearing layer 110 formed by the anisotropic etching determines the concentration distribution of an impurity region 200 to be formed later.

Figure 4E:
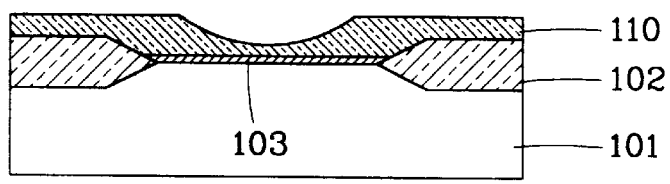
Figure 4F:
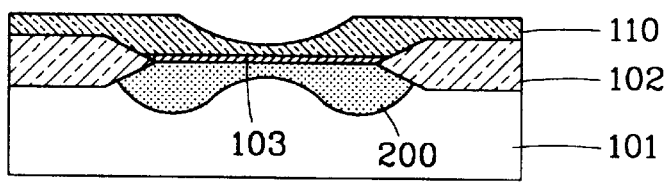

Next, the photoresist pattern 130 is then stripped (as shown in FIG. 4E), and the impurity included in the impurity-bearing layer 110 is driven by diffusion into the semiconductor substrate 101 at a temperature of 900°~950° C. to form a first conductive impurity region 200. Here, the first conductive impurity region 200 formed by the impurity diffusion has a nonuniform concentration distribution correspondingly to the shape of the impurity-bearing layer 110. The central portion of the first conductive impurity region 200 is formed to be a low-concentration shallow layer, while a high concentration deep layer is formed therein as the impurity region spreads out. That is, in the impurity region 200, the impurity-bearing concentration at the central portion of the gate electrode is about 1E16 atom/cm$^3$, while the impurity concentration near the edges of the gate electrode is made 1E17~1E18 atom/cm$^3$. The impurity-bearing concentration gradually decreases between these ranges in the areas between the central portion and the respective edges.

Figure 4G:
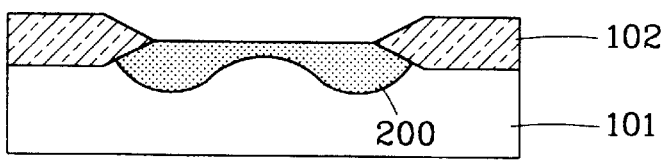
Figure 4H:
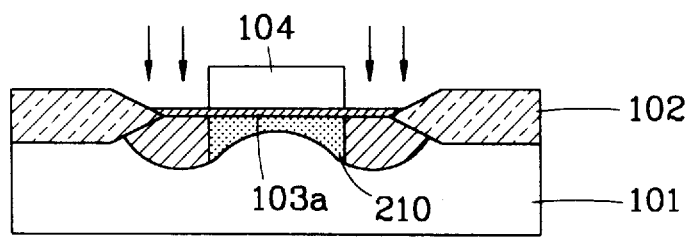
Figure 4I:
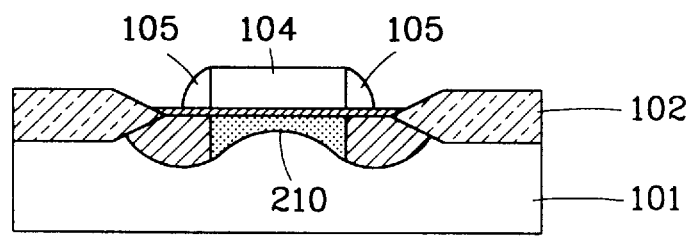
Figure 4J:
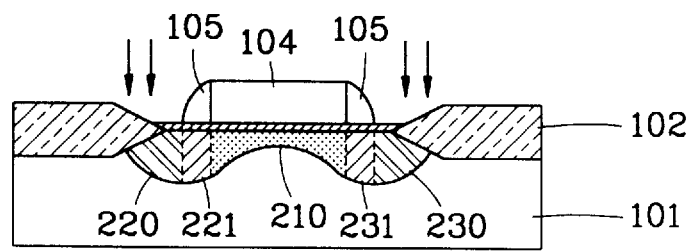

After the impurity diffusion process, as shown in FIG. 4G, the impurity-bearing layer 110 and the first oxide film 103 are stripped by etching. As shown in FIG. 4H, after a second oxide film 103a and a gate 104 are formed on the first impurity region 200 formed in the semiconductor substrate 101, an ion implantation is performed to form LDD regions 221, 231. Then sidewalls 105 are formed on the gate 104 as shown in FIG. 4I. The ion implantation is carried out again to form the second conductive impurity regions 220, 230. As a result, there are formed the channel formation region 210, the second conductive impurity regions 220,230 including the LDD regions 221,231 which serve as source/drain regions as seen in FIG. 4J. The second oxide film 103a is, e.g., an oxide silicon film formed by an oxidation process for the gate insulation. The first conductive impurity, of the first conductive impurity region 200 e.g., is boron, and the second conductive impurity of the second conductive impurity regions 220, 230, e.g., is arsenic(As) or phosphorus(P).

FIG. 3 is a cross-sectional view of the NUDC semiconductor memory device formed through the process illustrated in FIGS. 4A through 4J. As shown in the drawing, in a channel formation region 210 corresponding to part of the first conductive impurity region 200, the central portion of the channel 211 corresponding to the central portion of the gate 104 has a low concentration of impurity and a shallow longitudinal depth while the channel edges 213 corresponding to the edges of the gate 104 have an increasingly deep lengthwise depth, which shows a undulating curve having a minute deviation of impurity concentration.

In FIG. 3, reference numeral 212 denotes a mid-concentration impurity region located between the central portion of the channel 211 and the channel edges 213.

As described in detail above, the fabrication method for the NUDC semiconductor memory device is made simple by performing one process for an impurity diffusion, not a plurality of diffusions as in the conventional method, and an additional tilt & rotation apparatus is not required.

Further, the channel formation region having the NUDC construction has an advantage in that the concentration and depth of the doped impurity region has the shape of an undulating curve with respect to the device's crosswise length. That is, the concentration and depth of the impurity region has the shape of an undulating curve having a minute deviation as it approaches the central portion of the gate electrode from the edges thereof. As a result, the NUDC semiconductor memory device having a minimum degree of dependence of threshold voltage upon a gate width is fabricated.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A fabrication method for a semiconductor device comprising:

forming an impurity-bearing layer on a semiconductor substrate;

selectively etching the impurity-bearing layer to form a gate region whose thickness increases from a thin central portion thereof to increasingly thicker portions near the edges of the impurity-bearing layer;

forming a first conductive impurity region with an ion concentration varying in accordance with the varying thickness of the impurity-bearing layer by driving the impurity from the impurity-bearing layer into the semiconductor substrate;

stripping the impurity-bearing layer;

sequentially forming a gate insulating film and a gate electrode on the semiconductor substrate; and forming second conductive impurity region in the first conductive impurity region.

2. The method of claim 1, wherein in said impurity-bearing layer forming step the impurity-bearing layer is an oxide film containing an impurity.

3. The method of claim 1, wherein the step for selectively etching the impurity-bearing layer, comprises:

forming a photoresist layer on the impurity-bearing layer;

forming the photoresist pattern by stripping the photoresist layer at the gate electrode region; and performing an anisotropic etching on the impurity-bearing layer using the photoresist pattern as a mask.

4. The method of claim 1, wherein the step of forming the first conductive impurity region includes the step of:

forming the first conductive impurity region to have a lower impurity concentration region at the central portion of the first conductive impurity region and gradually higher impurity concentration regions extending from the central portion to the edges of the first conductive impurity region.

5. The method of claim 2, wherein the oxide film is composed of BSG (Boron Silicate Glass).

6. The method of claim 1, wherein in said impurity-bearing layer forming step the impurity-bearing layer is a doped polysilicon layer.

7. The method of claim 1, wherein in the step of forming the impurity-bearing layer, the impurity-bearing layer contains boron.

8. The method of claim 1, wherein the step of forming the first conductive impurity region includes the step of:

driving the impurity included in the impurity-bearing layer into the semiconductor substrate at a temperature of 900°–950° C. to form the first conductive impurity region.

9. The method of claim 8, wherein the step of forming an impurity-bearing layer comprises forming a doped polysilicon layer by in-situ doping using a chemical vapor deposition (CVD).

10. The method of claim 7, wherein in the step of forming the second conductive impurity regions, the second conductive impurity regions include arsenic(As).

11. The method of claim 7, wherein in the step of forming the second conductive impurity regions, the second conductive impurity regions include phosphorus(P).

12. The method of claim 4, wherein the lower impurity concentration region is thinner than the gradually higher impurity concentration regions of the first conductive impurity region.

13. The method of claim 4, wherein the step of sequentially forming the gate insulating film and the gate electrode includes the step of:

forming the gate electrode on a portion of the semiconductor substrate corresponding to the lower impurity concentration region.

14. The method of claim 1, farther comprising the step of:

performing ion-implantation on the first conductive impurity region using the gate electrode as a mask.

15. The method of claim 14, wherein the step of forming the second conductive impurity region includes the steps of:

forming sidewalls on the sides of the gate electrode, and performing ion-implantation on the first conductive impurity region using the gate electrode and the sidewalls as a mask, so as to form the second conductive impurity regions and lightly doped drain (LDD) regions below the sidewalls and adjacent to the second conductive impurity regions.

16. The method of claim 1, wherein the first conductive impurity region includes a channel region formed below the gate electrode, lightly doped drain (LDD) regions formed on the sides of the channel region, and high impurity concentration regions formed adjacent to the LDD regions.

17. A method of fabricating a semiconductor device, comprising the steps of:

forming an impurity-containing layer of a varying thickness on a substrate, the impurity-containing layer including a thin central portion and thicker side portions extending from the thin central portion;

driving the impurity from the impurity-containing layer into the substrate so as to form a conductive impurity region with ion concentration varying in accordance with the varying thickness of the impurity-containing layer;

removing the impurity-containing layer;

forming a gate insulating layer on the conductive impurity region of the substrate;

forming a gate electrode on a thin central portion of the conductive impurity region;

forming lightly doped drain (LDD) regions adjacent to the thin central portion of the first conductive impurity region; and forming high impurity concentration regions adjacent to the LDD regions in the conductive impurity region.

18. The method of claim 17, wherein the step of forming the LDD regions includes the step of:

performing ion-implantation on the conductive impurity region using the gate electrode as a mask.

19. The method of claim 18, wherein the step of forming the high impurity concentration regions includes the steps of:

forming sidewalls on the sides of the gate electrode; and performing ion-implantation on the conductive impurity region using the sidewalls and the gate electrode as a mask.

20. The method of claim 17, wherein the conductive impurity region in the substrate includes the thin central portion of low impurity concentration and thicker side portions of high impurity concentration formed on the sides of the thin central portion.

* * * * *